(12) United States Patent
Mochizuki et al.

(10) Patent No.: US 12,484,250 B2
(45) Date of Patent: Nov. 25, 2025

(54) HORIZONTALLY STACKED NANOSHEET GATE ALL AROUND DEVICE STRUCTURE

(71) Applicant: International Business Machines Corporation, Armonk, NY (US)

(72) Inventors: Shogo Mochizuki, Mechanicville, NY (US); Kangguo Cheng, Schenectady, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 733 days.

(21) Appl. No.: 17/701,772

(22) Filed: Mar. 23, 2022

(65) Prior Publication Data
US 2023/0307521 A1    Sep. 28, 2023

(51) Int. Cl.
| | |
|---|---|
| *H10D 30/00* | (2025.01) |
| *H01L 21/762* | (2006.01) |
| *H10D 30/01* | (2025.01) |
| *H10D 30/67* | (2025.01) |
| *H10D 62/10* | (2025.01) |
| *H10D 84/01* | (2025.01) |
| *H10D 84/03* | (2025.01) |

(52) U.S. Cl.
CPC ....... *H10D 30/6735* (2025.01); *H01L 21/762* (2013.01); *H10D 30/031* (2025.01); *H10D 30/6713* (2025.01); *H10D 30/6757* (2025.01); *H10D 62/115* (2025.01); *H10D 62/118* (2025.01); *H10D 84/0128* (2025.01); *H10D 84/013* (2025.01); *H10D 84/0147* (2025.01); *H10D 84/038* (2025.01)

(58) Field of Classification Search
CPC ............. H10D 62/122; H10D 30/6735; H10D 30/6757; H10D 84/0128; H10D 84/83
See application file for complete search history.

(56) References Cited

U.S. PATENT DOCUMENTS

| | | |
|---|---|---|
| 10,008,583 B1 | 6/2018 | Rodder |
| 10,211,307 B2 | 2/2019 | Ching et al. |
| 10,243,060 B2 | 3/2019 | Chao et al. |
| 10,332,803 B1 | 6/2019 | Xie |
| 2020/0075718 A1 | 3/2020 | Wang et al. |
| 2020/0381427 A1 | 12/2020 | Suh |
| 2021/0134949 A1 | 5/2021 | Ruilong |

*Primary Examiner* — Reema Patel
(74) *Attorney, Agent, or Firm* — Samuel Waldbaum; Otterstedt & Kammer PLLC

(57) ABSTRACT

A semiconductor structure includes a substrate disposed in a horizontal plane, a gate metal on the substrate, a first spacer and a second spacer on the substrate with the gate metal between the first spacer and the second spacer, and a plurality of horizontally stacked nanosheets extending between the first spacer and the second spacer, with the gate metal encapsulating the plurality of horizontally stacked nanosheets between the first spacer and the second spacer.

18 Claims, 8 Drawing Sheets

HORIZONTALLY STACKED NANOSHEET GATE ALL AROUND DEVICE STRUCTURE

BACKGROUND

The present disclosure relates generally to a logic device technologies, and more particularly to a horizontally stacked nanosheet gate-all-around (GAA) device structure.

Stacked nanosheet or nanowire GAA devices have been considered as promising technologies for high-density and high-performance with reduced power consumption.

BRIEF SUMMARY

According to embodiments of the present invention, a semiconductor structure includes: a substrate disposed in a horizontal plane; a gate metal over the substrate; and a plurality of horizontally stacked nanosheets encapsulated by the gate metal, wherein the plurality of horizontally stacked nanosheets have a major channel plane different than that of the substrate.

According to embodiments of the present invention, a semiconductor structure includes a substrate disposed in a horizontal plane, a gate metal on the substrate, a first spacer and a second spacer on the substrate with the gate metal between the first spacer and the second spacer, and a plurality of vertically oriented, horizontally stacked, nanosheets extending between the first spacer and the second spacer, with the gate metal encapsulating the plurality of vertically oriented, horizontally stacked, nanosheets between the first spacer and the second spacer.

According to some embodiments of the present invention, a method of forming a horizontally stacked gate-all-around nanosheet structure comprises: providing a silicon (Si) substrate; forming a sacrificial silicon-germanium (SiGe) layer and a Si channel region layer by epitaxial growth; forming a fin structure by patterning the Si substrate, the sacrificial SiGe layer and the Si channel region layer; forming a local shallow trench isolation (STI) layer on the Si substrate, wherein the local STI layer has a height sufficient to cover sidewalls of the sacrificial SiGe layer; forming, by epitaxial growth, a vertical sacrificial SiGe layer on the fin structure; and forming, by epitaxial growth, a vertical Si layer on the vertical sacrificial SiGe layer, wherein the vertical Si layer and the Si channel region layer of the fin structure form a plurality of horizontally stacked nanosheets. According to some embodiments of the present invention, the method of forming the horizontally stacked gate-all-around nanosheet structure further includes: forming a gate electrode material, gate sidewall spacers, and a gate cap on the Si channel region layer; forming a Si channel by removing a portion of the Si channel region layer, where the gate cap and the gate sidewall spacers are used as a mask; removing an exposed portion of the sacrificial SiGe layer and a portion of the sacrificial SiGe layer below the Si channel to form a SiGe pillar; depositing a nitride liner; patterning the nitride liner to form a first inner spacer on exposed portions of the SiGe pillar and a second inner spacer on sidewalls of the vertical sacrificial SiGe layer; forming doped source and drain regions on the second inner spacer; depositing an interlevel dielectric; exposing the gate electrode material; removing the gate electrode material; removing a portion of the local STI layer below the gate electrode material, the SiGe pillar below the Si channel, and the vertical sacrificial SiGe layer; depositing a high-K dielectric material; and depositing a work function metal surrounding the vertical Si layer. According to some aspects, forming the Si channel region layer by epitaxial growth comprises growing a Si material having a major channel plane different than that of the substrate.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware mod-ule(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. Some embodiments may not have these potential advantages and these potential advantages are not necessarily required of all embodiments. For example, one or more embodiments may provide for:

horizontally stacked GAA nanosheet structure;
horizontally stacked nanosheet channel, which has a major channel plane different than that of the substrate;
channel nanosheet thickness/space defined by vertical sacrificial SiGe/Si epitaxial growth thickness (e.g., less than about 10 nm and beyond extreme ultraviolet lithography (EUVL) capability);
compared to classic FinFET (fin field-effect transistor) devices, a horizontally stacked GAA nanosheet structure has improved electrostatics and improved pitch scaling.

These and other features and advantages of the present invention will become apparent from the following detailed description of illustrative embodiments thereof, which is to be read in connection with the accompanying drawings.

BRIEF DESCRIPTION OF THE DRAWINGS

Preferred embodiments of the present invention will be described below in more detail, with reference to the accompanying drawings.

DETAILED DESCRIPTION

Figure 1:
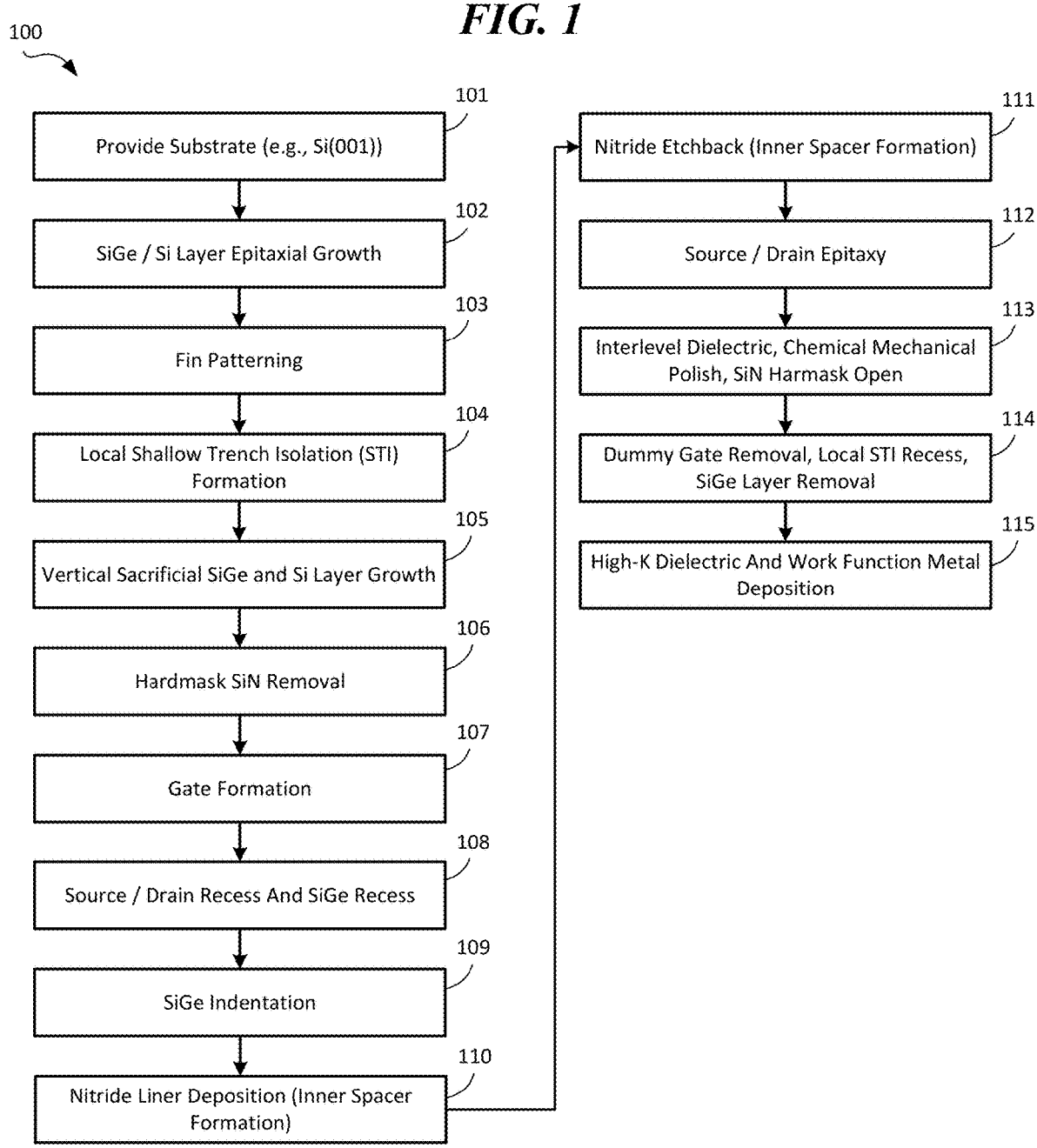
FIG. 1 illustrates methods for manufacturing a horizontally stacked gate-all-around nanosheet structure according to one or more embodiments of the present invention.

Embodiments of the present invention relate to horizontally stacked gate-all-around (GAA) nanosheet structures.

According to some aspects, a horizontally stacked nanosheet channel has a major channel plane different than that of a substrate. According to some aspects, a horizontally stacked GAA nanosheet structure comprises a channel nanosheet thickness/space that is defined by a vertical sacrificial SiGe/Si epitaxial growth thickness (e.g., less than about 10 nanometers (nm), which is beyond conventional extreme ultraviolet lithography (EUV) capabilities). According to some embodiments, a horizontally stacked GAA nanosheet structure exhibits improved electrostatics and pitch scaling.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

As described herein and according to some embodiments, a horizontally stacked GAA nanosheet structure comprises a channel nanosheet thickness/space(s) defined by a vertical sacrificial SiGe/Si epitaxial growth thickness, which can be less than about 10 nm and beyond (i.e., smaller than) conventional EUV capabilities. Furthermore, according to some embodiments, a horizontally stacked GAA nanosheet channel has a height defined by template Fin height. According to one or more embodiments, a method of manufacturing a horizontally stacked GAA nanosheet structure forms a horizontally stacked nanosheet channel having a major channel plane different than a substrate orientation, for example, a (110) oriented Si channel plane (Si(110)) with a (001) oriented Si substrate (Si(001)) or a Si(001) channel plane with a Si(110) substrate.

According to some embodiments and referring to FIG. 1, a method 100 of manufacturing a horizontally stacked GAA nanosheet structure comprises providing a silicon substrate at step 101 (e.g., Si(001)), and forming a sacrificial silicon-germanium (SiGe) layer and a Si channel region layer on the silicon substrate at step 102 to form a substrate stack. According to some embodiments, the sacrificial SiGe layer and the Si channel region layer are formed by epitaxial growth of the materials at step 102. According to some embodiments, the method includes patterning the substrate stack at step 103 to form a fin structure. According to at least one embodiment, the patterning of the substrate stack at step 103 includes depositing and patterning a hardmask (e.g., a SiN hardmask) on the Si channel region, and using the hardmask to perform the patterning. According to at least one embodiment, the patterning removes portions of each of the silicon substrate, the sacrificial SiGe layer, and the Si channel region layer. According to some embodiments, the method includes forming a local shallow trench isolation (STI) layer on the silicon substrate at step 104. According to some aspects, the local STI layer has a height sufficient to cover sidewalls of the sacrificial SiGe layer. According to some embodiments, the method includes forming vertically oriented sacrificial SiGe layers and vertically oriented Si layers on the Fins at step 105. According to some aspects, vertical sacrificial SiGe layers and vertical Si layers are formed by an epitaxial growth of the material. According to at least one embodiment, the hardmask is removed at step 106. According to at least one embodiment, a gate electrode material (gate electrode material stack), gate sidewall spacers, and a gate cap (e.g., gate mask) are formed at step 107. According to at least one embodiment, a portion of the Si channel region layer is removed at step 108 to form source/drain recesses, where the gate cap and the gate sidewall spacers are used as a mask. The removal of the portion of the Si channel region layer forms a Si channel comprising the Si channel region of the fin and the vertical Si layers. Furthermore, at step 108, an exposed portion of the sacrificial SiGe layer may be removed to form a SiGe recess, where the gate cap and the gate sidewall spacers are used as a mask. According to some embodiments, a second portion of the SiGe is removed below the Si channel, forming an SiGe indentation at step 109. According to some embodiments, the method includes the deposition of a nitride liner at step 110, for example, by ALD. The nitride liner may be an inner spacer on sidewalls of the Si channel, and on exposed portions of the Si substrate and the local STI layer. Furthermore, the nitride liner is formed on the gate sidewall spacers and the gate cap. According to some embodiments, the method includes a nitride liner etchback, forming an inner spacer in the SiGe indentation at step 111. According to some aspects, the method includes a source/drain epitaxy at step 112, forming doped source and drain regions. According to some aspects, the method includes an interlevel dielectric deposition, followed by a chemical mechanical polish, which opens the hardmask and exposes the gate electrode material at step 113. According to some aspects, the gate electrode material, a portion of the local STI layer located below the gate electrode material, and a remaining portion of the sacrificial SiGe layer below the Si channel are removed at step 114. According to some aspects, the remaining portion of the sacrificial SiGe layer is removed after the gate electrode material is pulled. According to one or more embodiments, a high-K dielectric material and work function metal are deposited at step 115. According to some embodiments, the high-K dielectric material encapsulates the nanosheets and lines exposed trenches/recesses. According to one or more embodiments, the work function metal is deposited on the high-K dielectric material.

Figure 2:
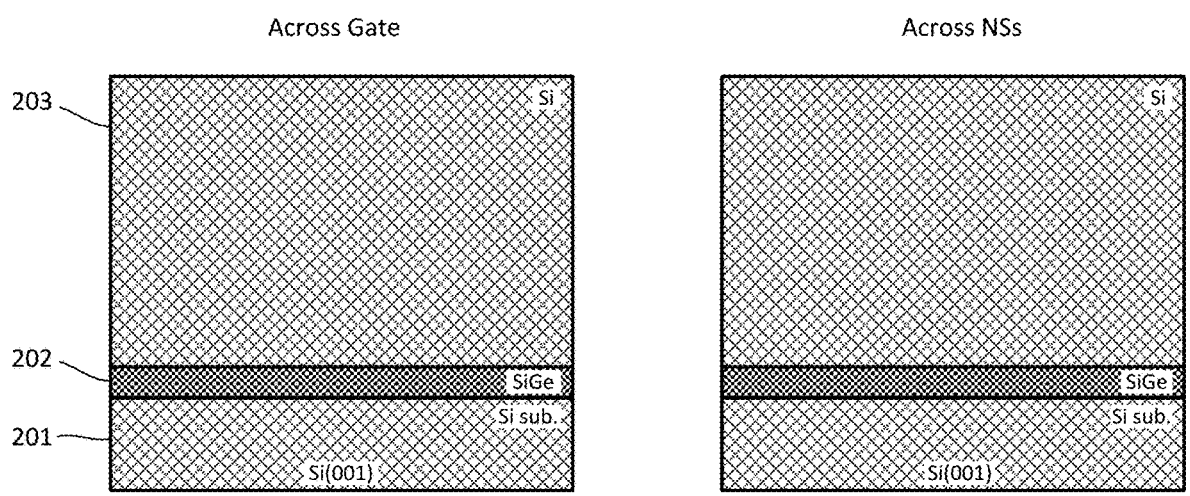
FIGS. 2-15 are cross-section views of a device according to one or more embodiments of the present invention.

According to some embodiments and referring to FIGS. 2-15, a method of manufacturing a horizontally stacked GAA nanosheet structure comprises providing a substrate stack including a silicon substrate 201 (e.g., Si(001)), a sacrificial SiGe layer 202 and a Si channel region layer 203 (see FIG. 2). According to some embodiments, the sacrificial SiGe layer and the Si channel region layer are formed by epitaxial growth of the materials.

Figure 3:
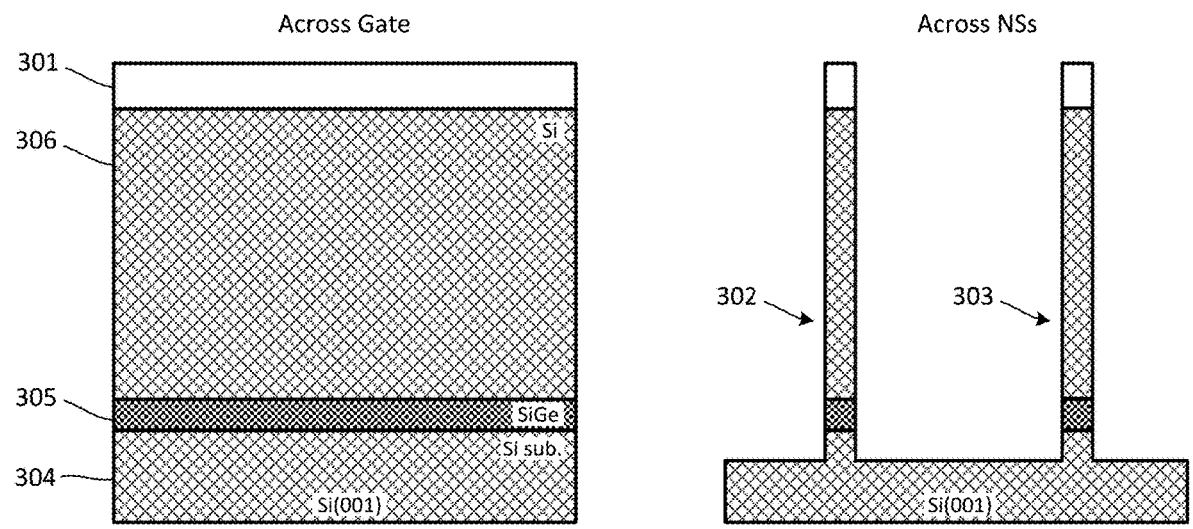

According to some embodiments and referring to FIG. 3, the method includes patterning the substrate stack to form a fin structure including a first Fin 302 and a second Fin 303. According to some aspects, the first Fin and the second Fin extend perpendicular to the silicon substrate. According to at least one embodiment, the patterning of the substrate stack includes depositing and patterning a hardmask 301 (e.g., a SiN hardmask) on the Si channel region, and using the hardmask to perform the patterning removing material as viewed across the nanosheets (NSs). According to at least one embodiment, the patterning removes portions of each of the silicon substrate, the sacrificial SiGe layer, and the Si channel region layer, including forming a recessed silicon substrate 304, patterned sacrificial SiGe layer 305, and a patterned Si channel region layer 306.

Figure 4:
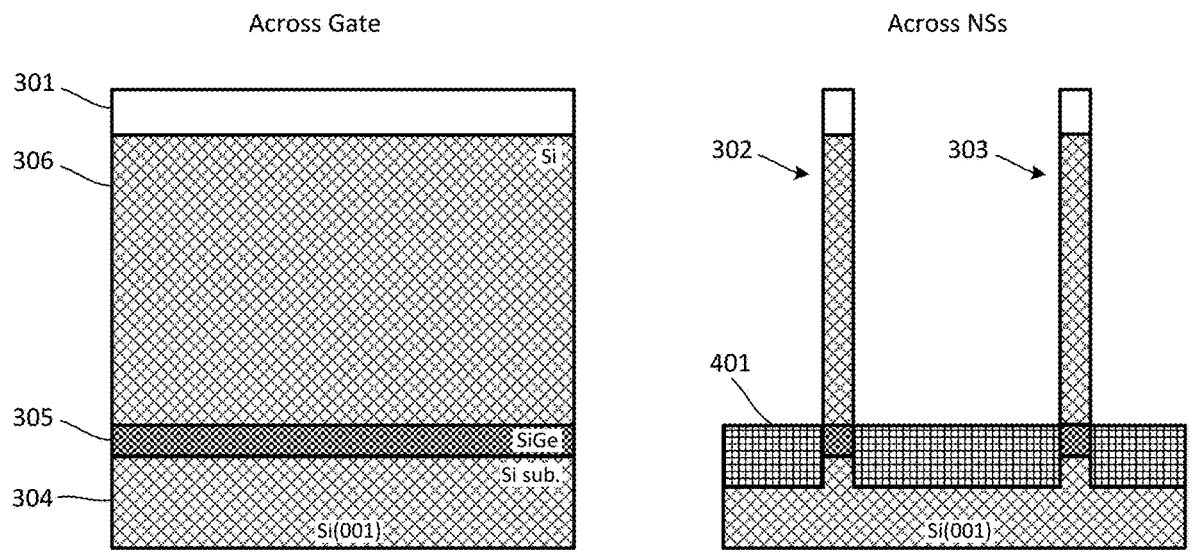

According to some embodiments and referring to FIG. 4, the method includes forming a local shallow trench isolation (STI) layer 401 on the silicon substrate 201. According to some aspects, the local STI layer has a height sufficient to cover sidewalls of the patterned sacrificial SiGe layer 305.

Figure 5:
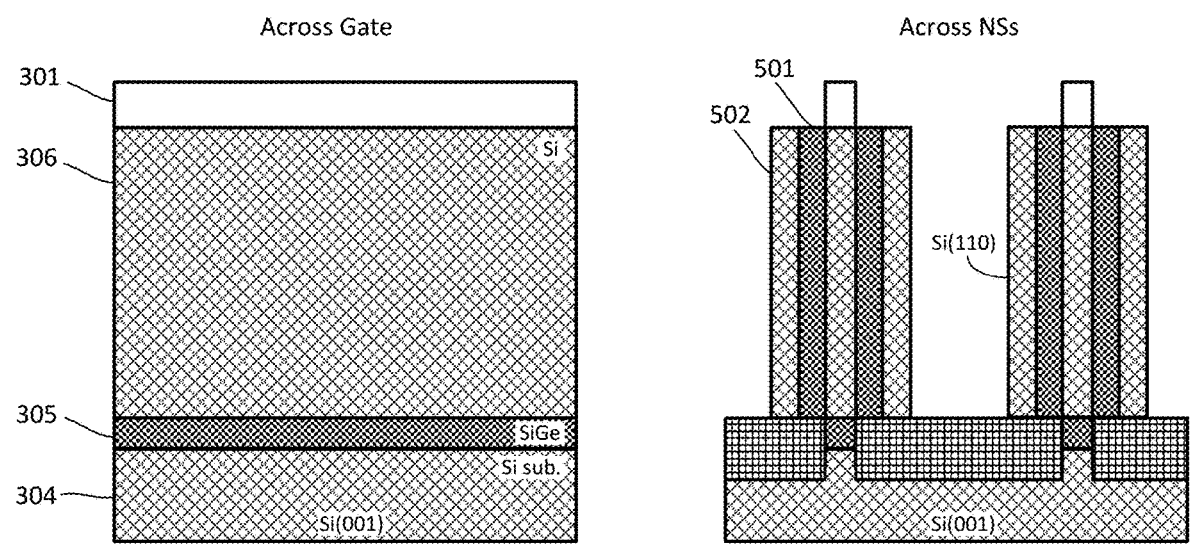

According to some embodiments and referring to FIG. 5, the method includes forming vertical sacrificial SiGe layers 501 and vertical Si layers 502 on each side of the first Fin 302 and the second Fin 303. According to some aspects, the vertical sacrificial SiGe layers and the vertical Si layers are formed by an epitaxial growth of the material.

Figure 6:
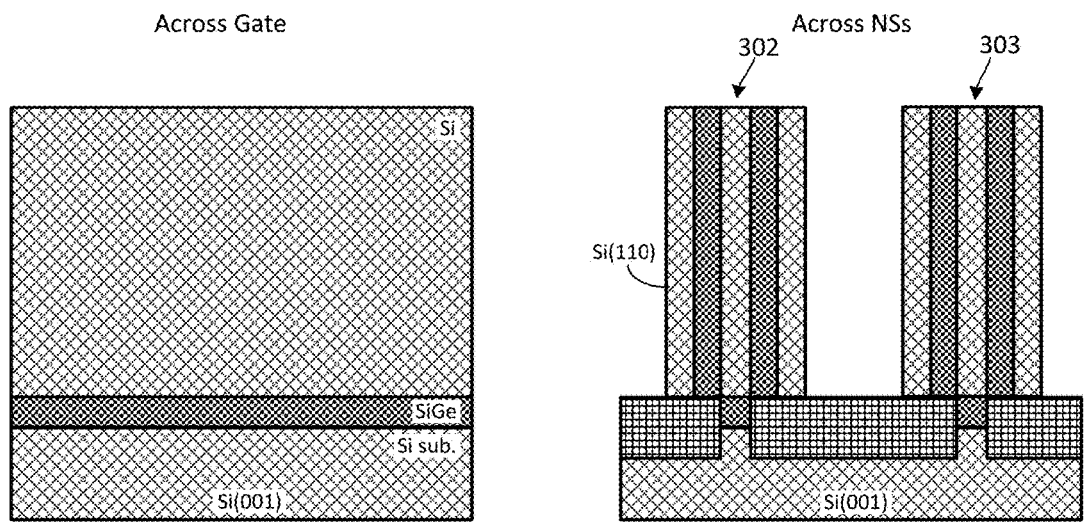

According to at least one embodiment and referring to FIG. 6, the hardmask is removed, e.g., by a dry and/or wet etch process, exposing a top surface of the first Fin 302 and the second Fin 303.

Figure 7:
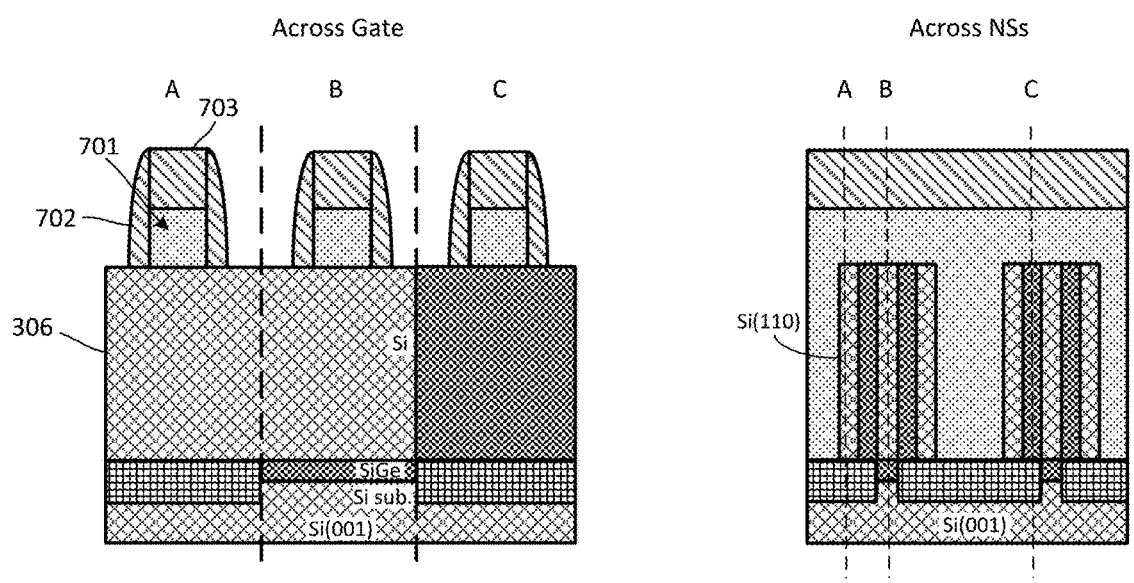

According to at least one embodiment and referring to FIG. 7, a gate electrode material 701, gate sidewall spacers 702, and a gate cap 703 (e.g., gate mask) are formed. It should be understood that FIG. 7 shows three sections, A-C, across the gate, which are illustrated as lines in the view across the NSs. More particularly, in the horizontally stacked nanosheet channel of FIGS. 7-15, section A is a cross-section at a side sheet of the horizontally stacked nanosheets, section B is a cross-section at a middle sheet, and section C is a cross-section between a side sheet and a middle sheet.

Figure 8:
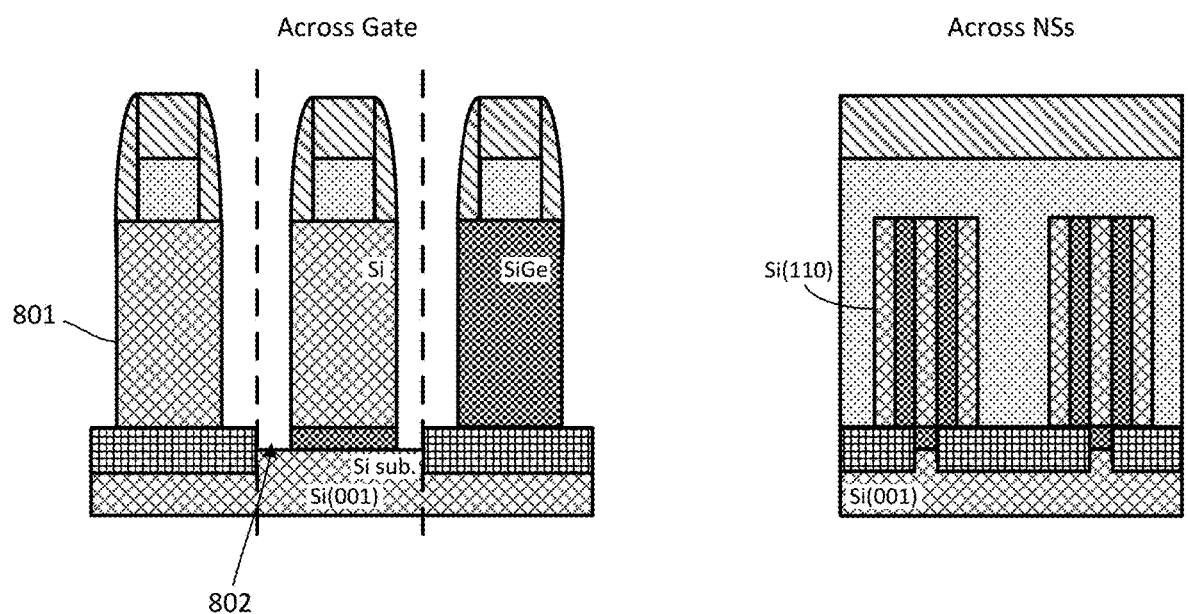

According to at least one embodiment and referring to FIG. 8, a portion of the patterned Si channel region layer 306 is removed, where the gate cap and the gate sidewall spacers are used as a mask to form a Si channel 801. Furthermore, an exposed portion of the sacrificial SiGe layer may be removed to form a SiGe recess 802, where the gate cap and the gate sidewall spacers are used as a mask. The portion of the patterned Si channel region layer and the exposed portion of the sacrificial SiGe layer may be removed by, for example, a directional reactive ion etch (RIE). According to some embodiments, the etch recesses the Si and SiGe forming the source/drain regions with the gate cap and gate sidewall spacers functioning as masks, directionally.

Figure 9:
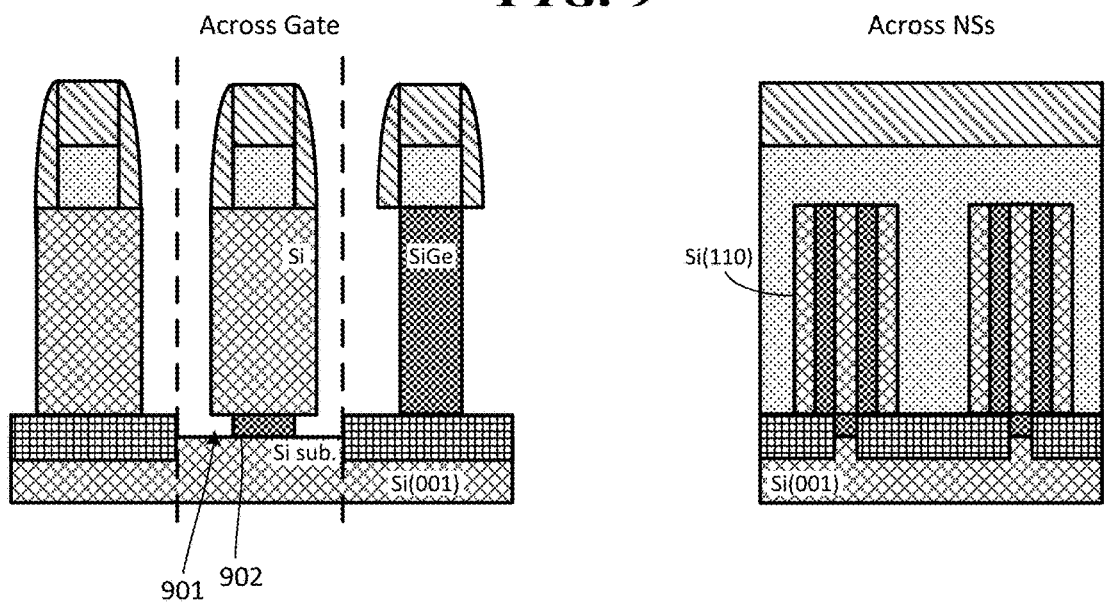

According to some embodiments and referring to FIG. 9, a second portion of the sacrificial SiGe is removed below the Si channel, forming an SiGe indentation 901 and a SiGe pillar 902 below the Si channel, and a third portion of the sacrificial SiGe is removed below the gate sidewall spacers 702 in the cross-section C (see FIG. 7). Example processes for removing portions of the sacrificial SiGe include dry and/or wet etch process. It should be understood that the removal of the second and third portions of the sacrificial SiGe can be a separate process(es) from the initial etch (i.e., the directional plasma etch for the creation of the source/drain recesses). According to some aspects, the process of removing the second and third portions of the sacrificial SiGe may be a selective un-isotropic SiGe etch (with no etch of Si).

Figure 10:
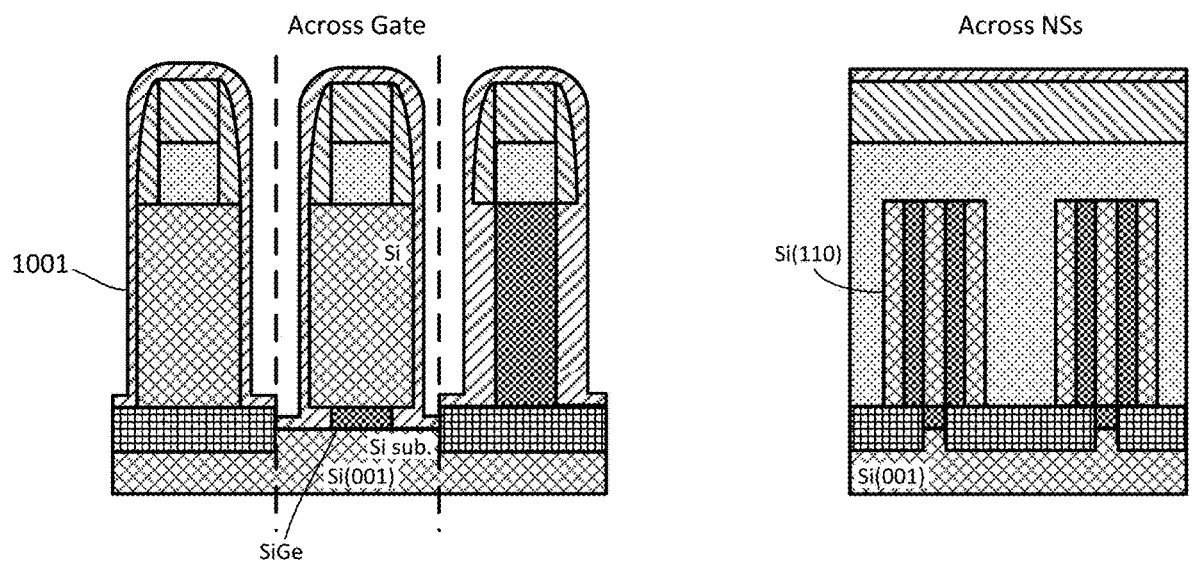

According to some embodiments and referring to FIG. 10, the method includes the deposition of a nitride liner 1001, for example, by ALD. The nitride liner may be an inner spacer on sidewalls of the Si channel, and on exposed sacrificial SiGe portions, and on exposed portions of the Si substrate and the local STI layer. Furthermore, the nitride liner may be formed on the gate sidewall spacers and the gate cap.

Figure 11:
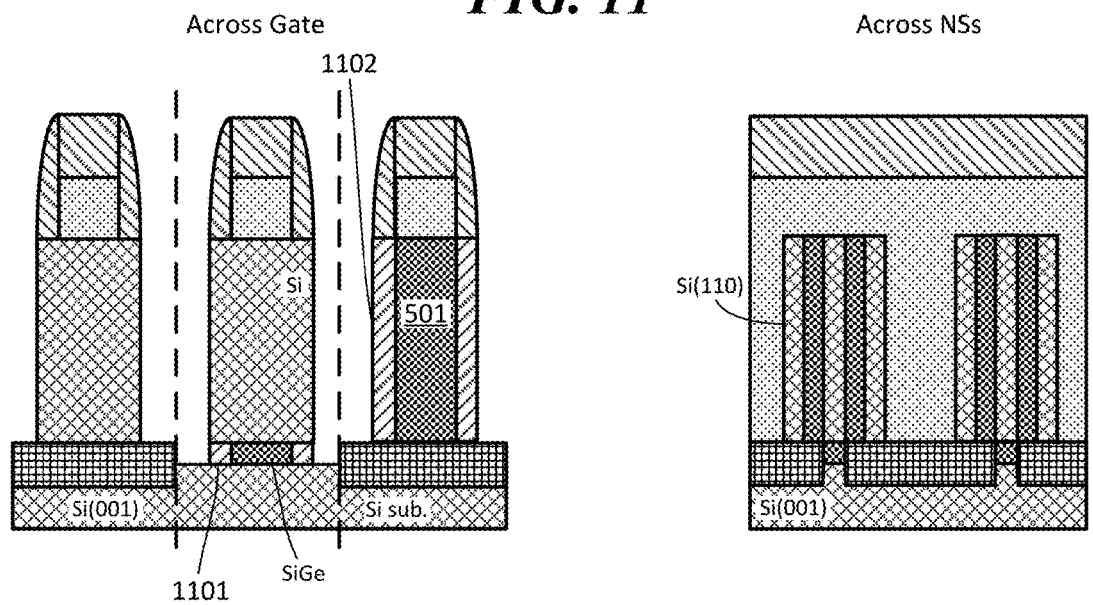

According to some embodiments and referring to FIG. 11, the method includes a nitride liner etchback, forming first inner spacers 1101 in the SiGe indentation and second inner spacers 1102 on sidewalls of the vertical sacrificial SiGe layers 501.

Figure 12:
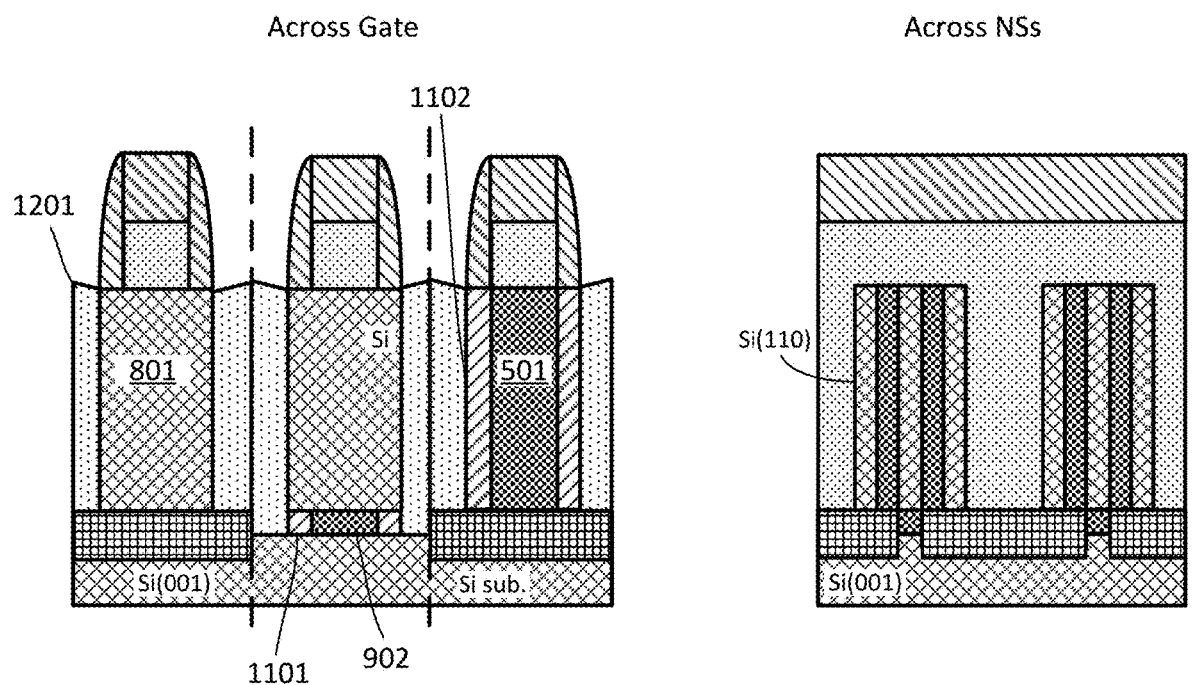

According to some aspects and referring to FIG. 12, the method includes a source/drain epitaxy, forming doped source and drain regions 1201. According to some embodiments, the forming doped source and drain regions 1201 have a height sufficient to cover the Si channel 801. According to some aspects, the first inner spacers 1101 and the second inner spacers 1102 separate the doped source and drain regions 1201 from the SiGe pillar 902 and the vertical sacrificial SiGe layers 501.

Figure 13:
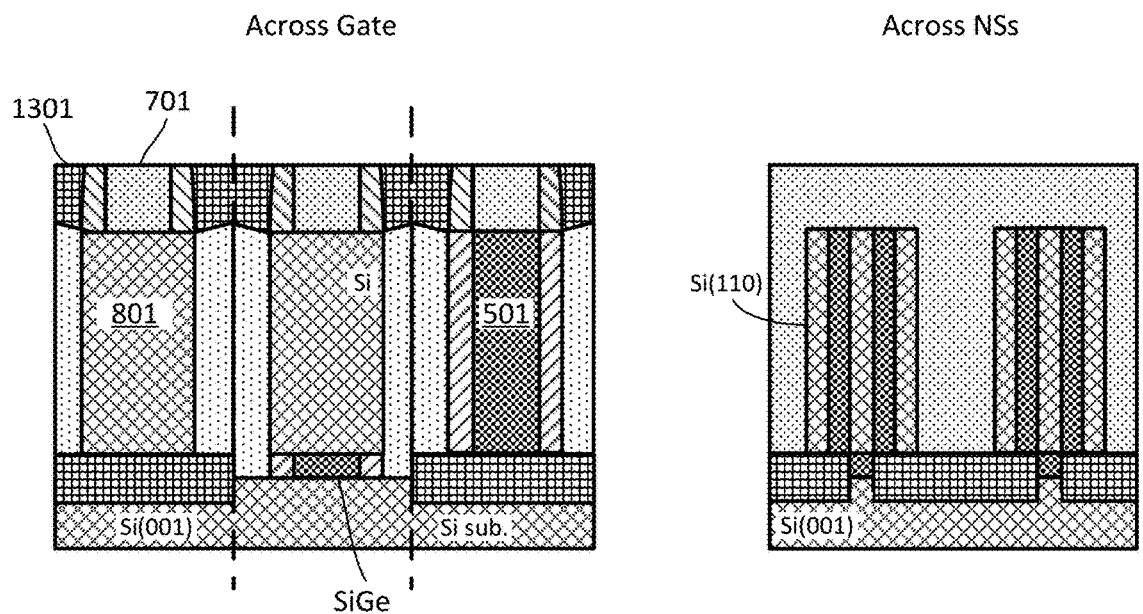

According to some aspects and referring to FIG. 13, the method includes depositing an interlevel dielectric 1301, followed by a OH, which removes the hardmask and exposes the gate electrode material 701.

Figure 14:
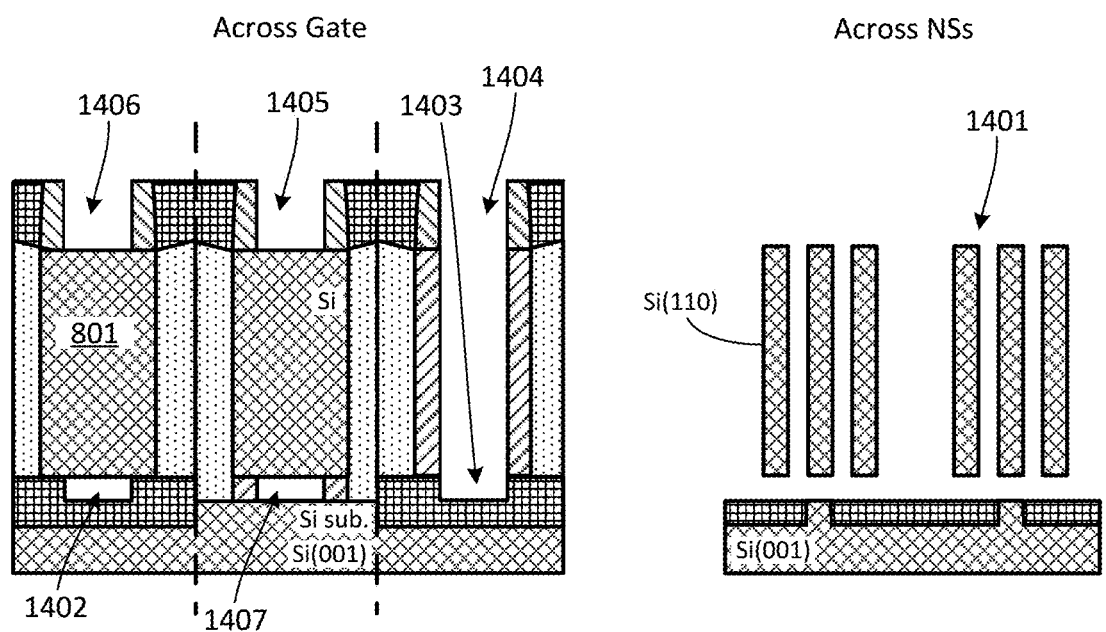

According to some aspects and referring to FIG. 14, the gate electrode material, a portion of the local STI layer located below the gate electrode material, and the SiGe pillar below the Si channel (Si channel release) are removed, for example, by dry and/or wet etch process(es), which exposes the nanosheets 1401 and a surface of a remaining portion of the local shallow trench isolation (STI) layer 1403. According to at least one embodiment, a recess 1402 is formed when the local STI is etched, for example, by isotropic etch process (e.g., a wet process). According to some aspects, any remaining portion of the sacrificial SiGe layer, including the SiGe pillar, may be removed after the gate electrode material is removed.

Figure 15:
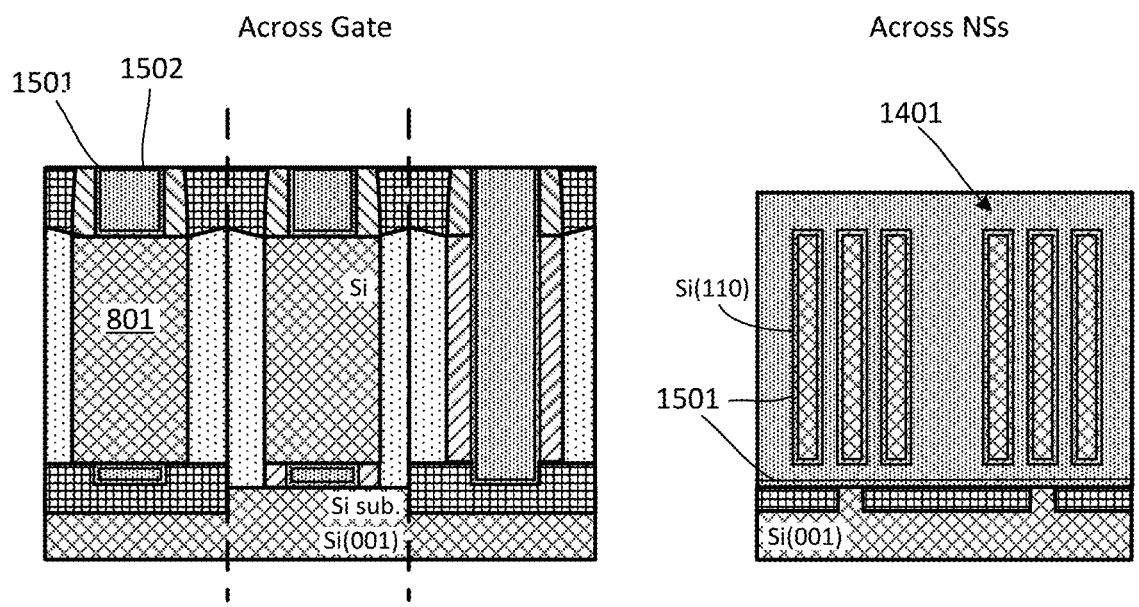

According to one or more embodiments and referring to FIG. 15, a high-K dielectric material 1501 and work function metal 1502 are deposited. According to some embodiments, the high-K dielectric material 1501 encapsulates the nanosheets 1401 and lines the exposed trenches 1404-1406 and recesses 1402, 1407 (see also FIG. 14). According to one or more embodiments, the work function metal 1502 is deposited on the high-K dielectric material 1501. According to some embodiments the work function metal 1502 is a gate metal.

Recapitulation:

According to embodiments of the present invention, a semiconductor structure includes: a substrate (recessed silicon substrate 304) disposed in a horizontal plane; a gate metal (work function metal 1502) over the substrate; and a plurality of horizontally stacked nanosheets (the nanosheets 1401) encapsulated by the gate metal, wherein the plurality of horizontally stacked nanosheets have a major channel plane different than that of the substrate.

According to embodiments of the present invention, a semiconductor structure includes a substrate (recessed silicon substrate 304) disposed in a horizontal plane, a gate metal (work function metal 1502) on the substrate, a first spacer and a second spacer (second inner spacers 1102) on the substrate with the gate metal between the first spacer and the second spacer, and a plurality of vertically oriented, horizontally stacked, nanosheets (nanosheets 1401) extending between the first spacer and the second spacer, with the gate metal encapsulating the plurality of vertically oriented, horizontally stacked, nanosheets between the first spacer and the second spacer.

According to embodiments of the present invention, a method of forming a horizontally stacked gate-all-around nanosheet structure comprising: providing a silicon (Si) substrate (at step 102); forming a sacrificial silicon-germanium (SiGe) layer and a Si channel region layer by epitaxial growth (at step 102); forming a fin structure (at step 103) by patterning the Si substrate, the sacrificial SiGe layer and the Si channel region layer; forming a local shallow trench isolation (STI) layer on the Si substrate (at step 104), wherein the local STI layer has a height sufficient to cover sidewalls of the sacrificial SiGe layer; forming (at step 105), by epitaxial growth, a vertical sacrificial SiGe layer on the fin structure; and forming (at step 105), by epitaxial growth, a vertical Si layer on the vertical sacrificial SiGe layer, wherein the vertical Si layer and the Si channel region layer of the fin structure form a plurality of horizontally stacked nanosheets. According to some embodiments of the present invention, the method of forming the horizontally stacked gate-all-around nanosheet structure further includes: forming (at step 107) a gate electrode material, gate sidewall spacers, and a gate cap on the Si channel region layer; forming (at step 108) a Si channel by removing a portion of the Si channel region layer, where the gate cap and the gate sidewall spacers are used as a mask; removing (at step 109) an exposed portion of the sacrificial SiGe layer and a portion of the sacrificial SiGe layer below the Si channel to form a SiGe pillar; depositing (at step 110) a nitride liner; patterning (at step 111) the nitride liner to form a first inner spacer on exposed portions of the SiGe pillar and a second inner spacer on sidewalls of the vertical sacrificial SiGe layer; forming (at step 112) doped source and drain regions on the second inner spacer; depositing (at step 113) an interlevel dielectric; exposing (at step 113) the gate electrode material; removing the gate electrode material (at step 114); removing (at step 114) a portion of the local STI layer below the gate electrode material, the SiGe pillar below the Si channel, and the vertical sacrificial SiGe layer; depositing (at step 115) a high-K dielectric material; and depositing (at step 115) a work function metal surrounding the vertical Si layer. According to some aspects, forming the Si channel region layer by epitaxial growth comprises growing a Si material having a major channel plane different than that of the substrate.

The terminology used herein is for the purpose of describing particular embodiments only and is not intended to be limiting of the invention. As used herein, the singular forms "a," "an" and "the" are intended to include the plural forms as well, unless the context clearly indicates other-wise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a substrate disposed in a horizontal plane;
   a gate metal over the substrate; and
   a plurality of horizontally stacked nanosheets encapsulated by the gate metal,
   wherein the plurality of horizontally stacked nanosheets have a major channel plane different than that of the substrate.

2. The semiconductor structure of claim 1, further comprising:
   a first spacer and a second spacer over the substrate with the gate metal between the first spacer and the second spacer and the plurality of horizontally stacked nanosheets extending between the first spacer and the second spacer.

3. The semiconductor structure of claim 2, further comprising:

a source region on a sidewall of the first spacer opposite the gate metal; and a drain region on a second of the second spacer opposite the gate metal, wherein the plurality of horizontally stacked nanosheets extend through the first spacer and the second spacer and contact the source region and the drain region.

4. The semiconductor structure of claim 1, further comprising a local shallow trench isolation layer directly on the substrate.

5. The semiconductor structure of claim 4, wherein the substrate includes a portion extending through the local shallow trench isolation layer and contacting the gate metal below at least one of nanosheet of the plurality of horizontally stacked nanosheets.

6. A semiconductor structure comprising:
a substrate disposed in a horizontal plane;
a gate metal on the substrate;
a first spacer and a second spacer on the substrate with the gate metal between the first spacer and the second spacer; and
a plurality of vertically oriented, horizontally stacked, nanosheets extending between the first spacer and the second spacer, with the gate metal encapsulating the plurality of vertically oriented, horizontally stacked, nanosheets between the first spacer and the second spacer.

7. The semiconductor structure of claim 6, wherein a width of each of the plurality of vertically oriented, horizontally stacked, nanosheets is less than 10 nanometers.

8. The semiconductor structure of claim 6, wherein a space between at least two adjacent ones of the plurality of vertically oriented, horizontally stacked, nanosheets is less than 10 nanometers.

9. The semiconductor structure of claim 6, wherein each of the plurality of vertically oriented, horizontally stacked, nanosheets extends perpendicular to the substrate.

10. The semiconductor structure of claim 6, wherein each of the plurality of vertically oriented, horizontally stacked, nanosheets extends is a plane different than the horizontal plane of the substrate.

11. The semiconductor structure of claim 6, wherein the plurality of vertically oriented, horizontally stacked, nanosheets have a major channel plane different than that of the substrate.

12. The semiconductor structure of claim 6, wherein the substrate has a Si(001) channel plane as major channel region and the plurality of horizontally stacked nanosheets have a Si(110) channel plane as major channel region.

13. The semiconductor structure of claim 6, wherein the substrate has a Si(110) channel plane as major channel region and the plurality of vertically oriented, horizontally stacked, nanosheets have a Si(001) channel plane as major channel region.

14. The semiconductor structure of claim 6, further comprising a local shallow trench isolation (STI) layer on the substrate and below the first spacer and the second spacer.

15. The semiconductor structure of claim 6, wherein the gate metal is below each of the plurality of vertically oriented, horizontally stacked, nanosheets.

16. The semiconductor structure of claim 15, further comprising a first inner spacer formed around the gate metal under a least one of the plurality of horizontally stacked nanosheets.

17. The semiconductor structure of claim 6, further comprising gate sidewall spacers formed on the first spacer and the second spacer.

18. The semiconductor structure of claim 6, further comprising:
a source region disposed on the first spacer opposite the gate metal; and
a drain region disposed on the second spacer opposite the gate metal,
wherein portion of the plurality of vertically oriented, horizontally stacked, nanosheets extend through the first spacer and the second spacer and contact the source region and the drain region.

* * * * *